(12) United States Patent
Kaneko et al.

(10) Patent No.: US 7,968,397 B2
(45) Date of Patent: Jun. 28, 2011

(54) SEMICONDUCTOR DEVICE AND METHOD OF MANUFACTURING THE SAME

(75) Inventors: Akio Kaneko, Kawasaki (JP); Seiji Inumiya, Yokohama (JP); Katsuyuki Sekine, Yokohama (JP); Kazuhiro Eguchi, Chigasaki (JP); Motoyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/659,250

(22) Filed: Mar. 2, 2010

(65) Prior Publication Data

US 2010/0159686 A1    Jun. 24, 2010

Related U.S. Application Data

(60) Continuation of application No. 12/081,824, filed on Apr. 22, 2008, now Pat. No. 7,687,869, which is a division of application No. 10/738,049, filed on Dec. 18, 2003, now Pat. No. 7,375,403.

(30) Foreign Application Priority Data

Sep. 26, 2003    (JP) ................................. 2003-335966

(51) Int. Cl.
H01L 21/38    (2006.01)
(52) U.S. Cl. ......... 438/199; 438/599; 257/405; 257/408
(58) Field of Classification Search .................. 438/199, 438/599; 257/405, 408
See application file for complete search history.

(56) References Cited

U.S. PATENT DOCUMENTS

| 6,297,539 | B1 | 10/2001 | Ma et al. |
| 6,747,316 | B2 | 6/2004 | Matsuoka et al. |
| 6,844,234 | B2 | 1/2005 | Eguchi et al. |
| 2001/0023120 | A1 | 9/2001 | Yoshitaka et al. |
| 2002/0090830 | A1 | 7/2002 | Inumiya et al. |
| 2003/0127640 | A1 | 7/2003 | Eguchi et al. |
| 2004/0142518 | A1 | 7/2004 | Yu et al. |
| 2005/0059198 | A1 | 3/2005 | Visokay et al. |

FOREIGN PATENT DOCUMENTS

| JP | 2000-332235 | 11/2000 |
| JP | 2002-280461 | 9/2002 |
| JP | 2005-93815 | 4/2005 |

OTHER PUBLICATIONS

Kedzierski, J. et al., "Metal-Gate FinFET and Fully-Depleted SOI Devices Using Total Gate Silicidation," IEEE, 4 pages, (2002).
Notification of Reasons for Rejection issued by the Japanese Patent Office, mailed Nov. 15, 2005, in Japanese Patent Application No. 2003-335966, and English-language translation thereof.

*Primary Examiner* — Howard Weiss
*Assistant Examiner* — Steven H Rao
(74) *Attorney, Agent, or Firm* — Finnegan, Henderson, Farabow, Garrett & Dunner, L.L.P

(57) ABSTRACT

A semiconductor device according to the present invention comprises a semiconductor substrate, a gate insulating film which is composed of a material whose main component is a tetravalent metal oxide, a mixture of a tetravalent metal oxide and $SiO_2$, or a mixture of a tetravalent metal oxide and SiON and which containing B when it is in an nMOS structure on the semiconductor substrate or containing at least one of P and As when it is in a pMOS structure on the semiconductor substrate, and a gate electrode made of a metal having a work function of 4 eV to 5.5 eV.

15 Claims, 13 Drawing Sheets

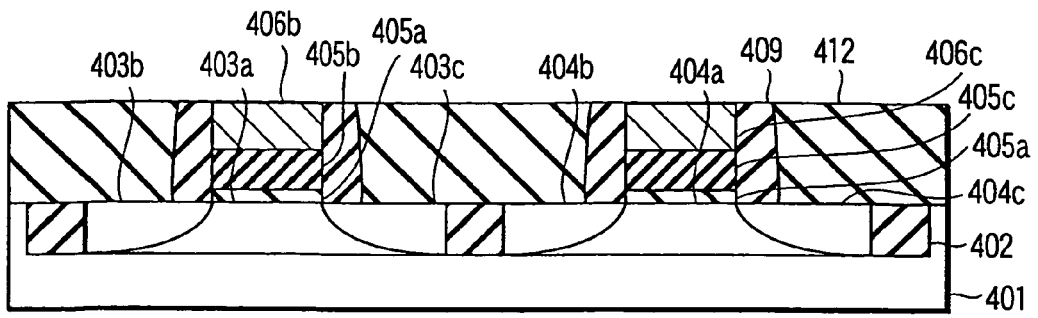
F I G. 21
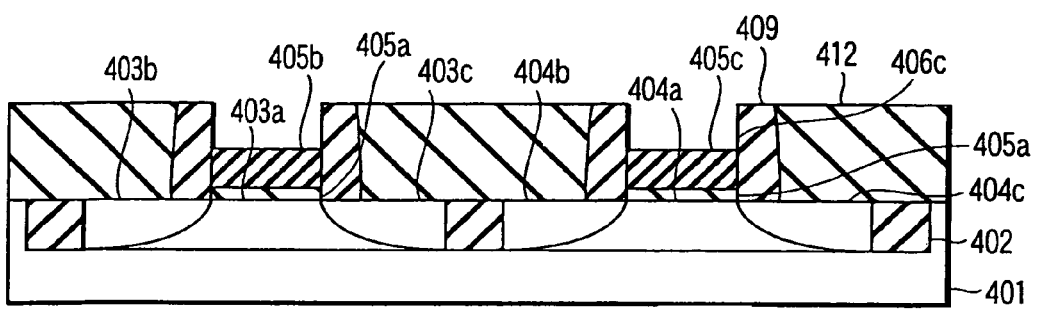
F I G. 22
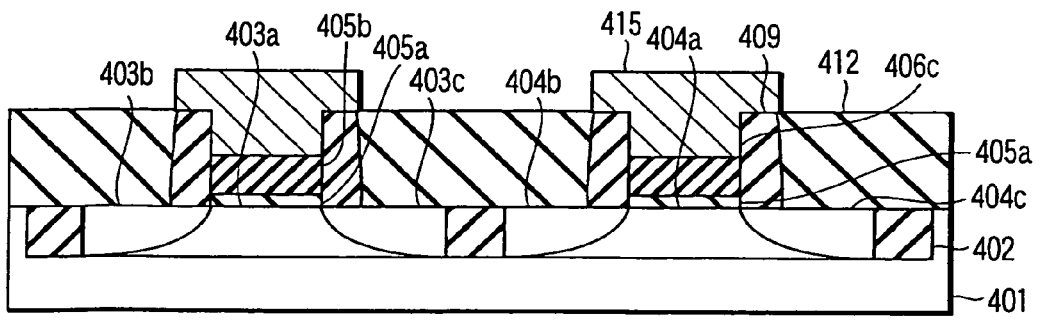
F I G. 23
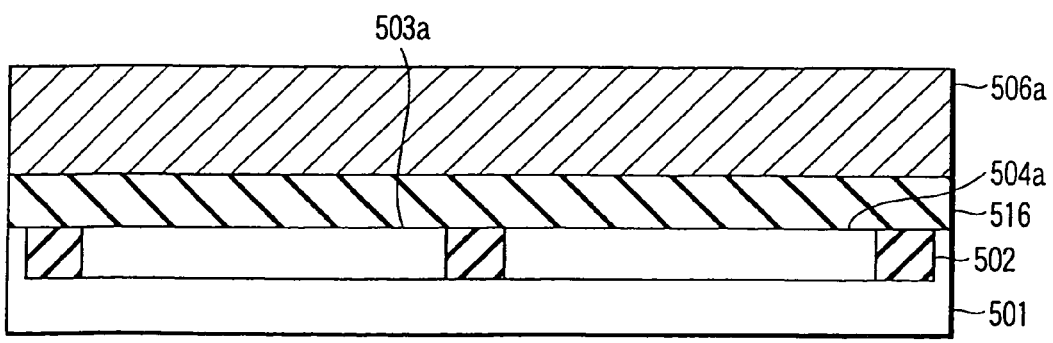
F I G. 24

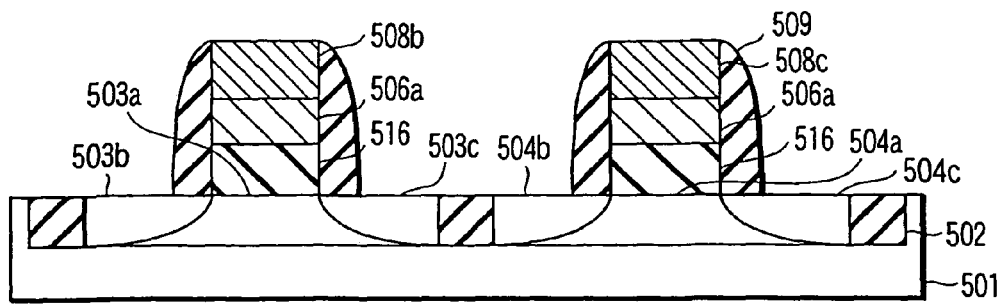
F I G. 25
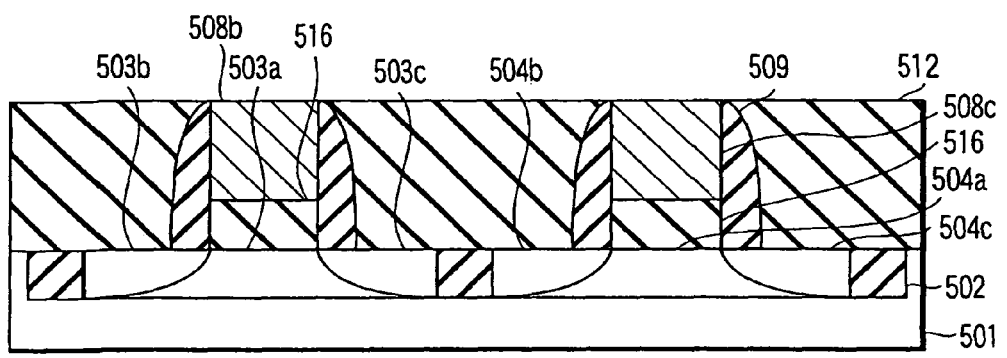
F I G. 26
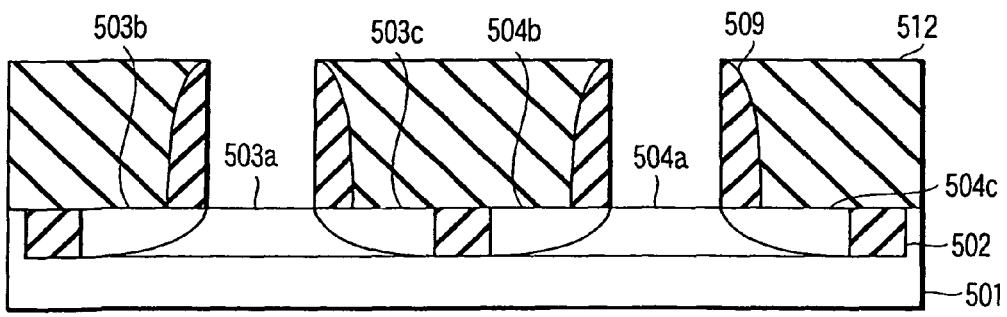
F I G. 27
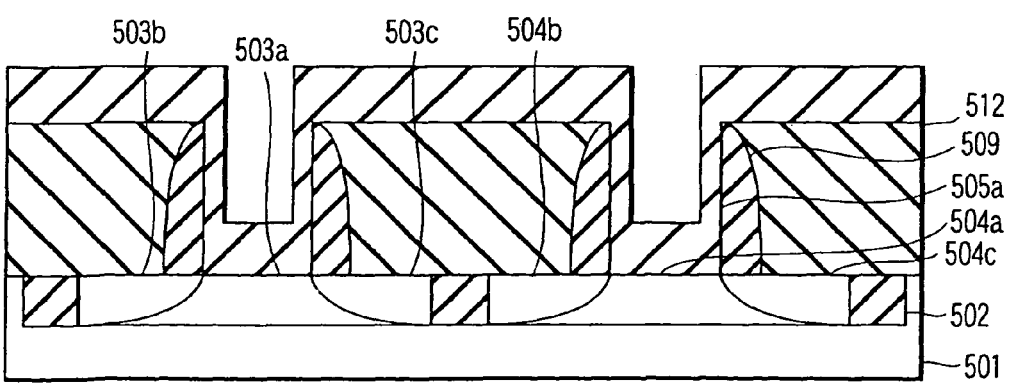
F I G. 28

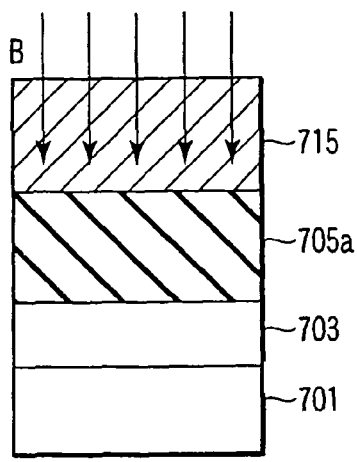 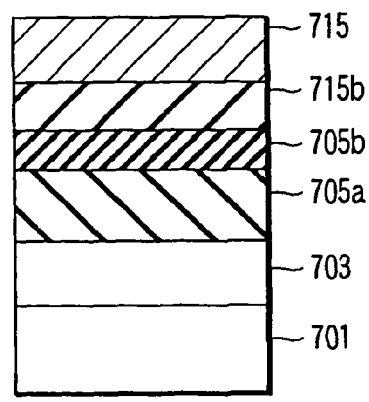
FIG. 32A                     FIG. 32B
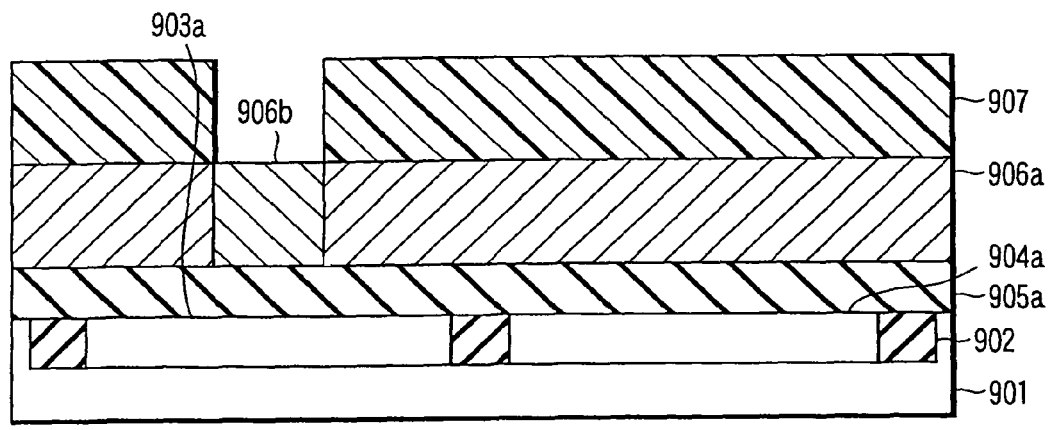
FIG. 33
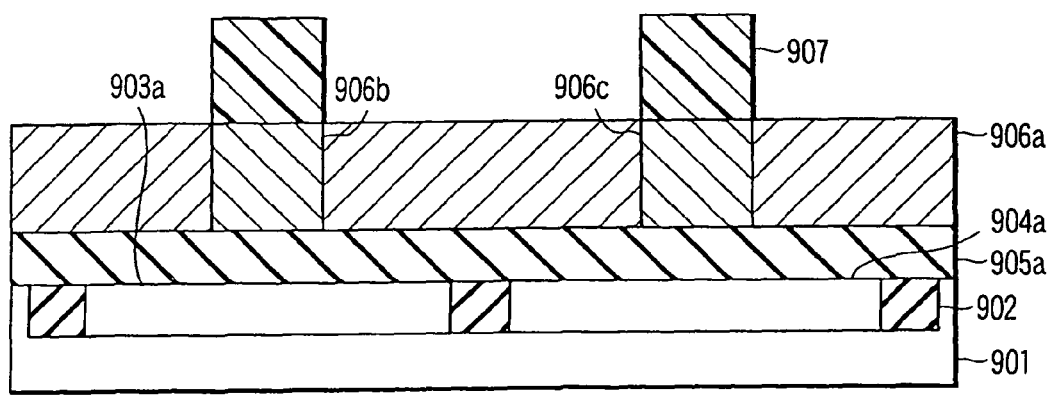
FIG. 34

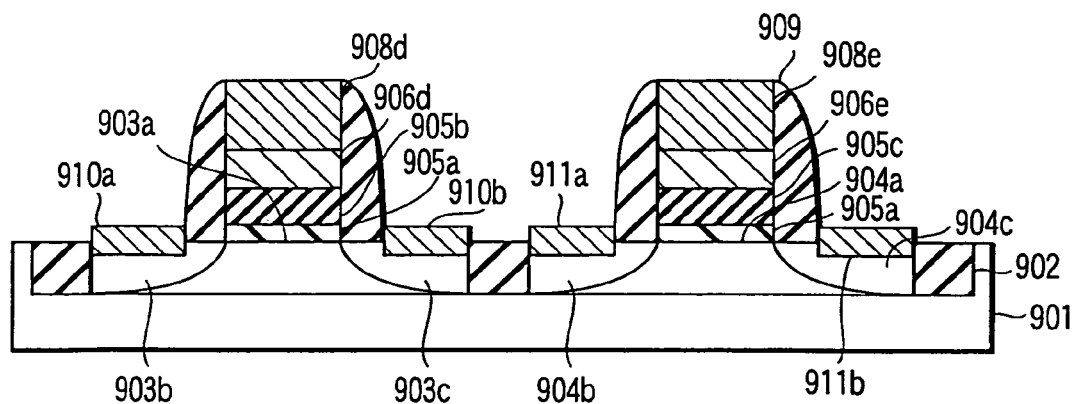
F I G. 39
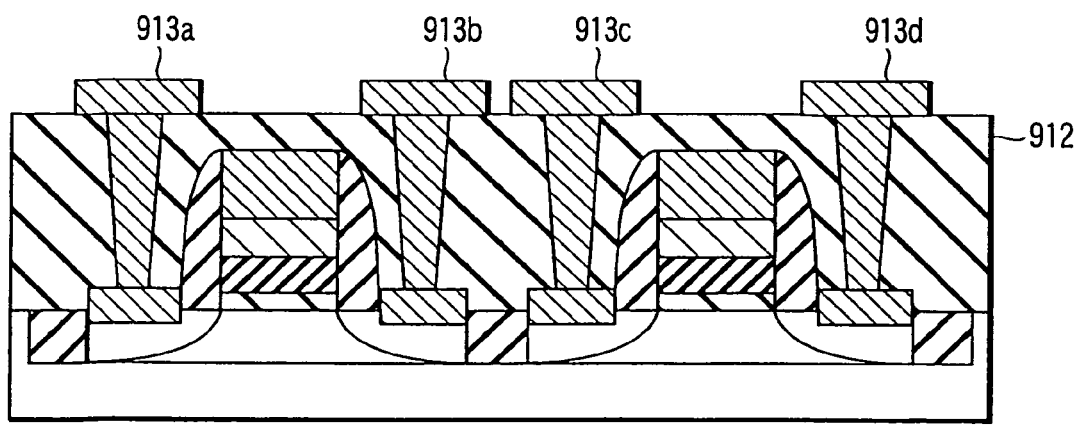
F I G. 40

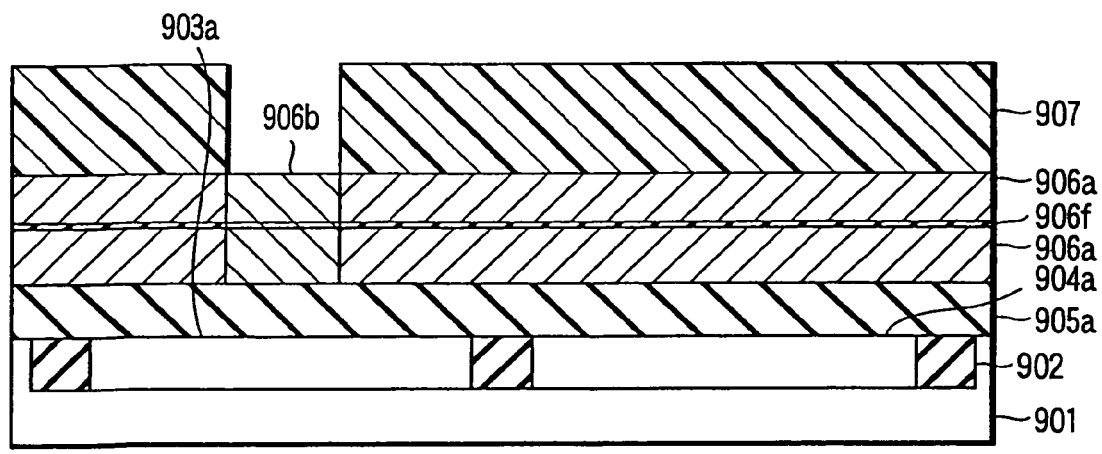
F I G. 41
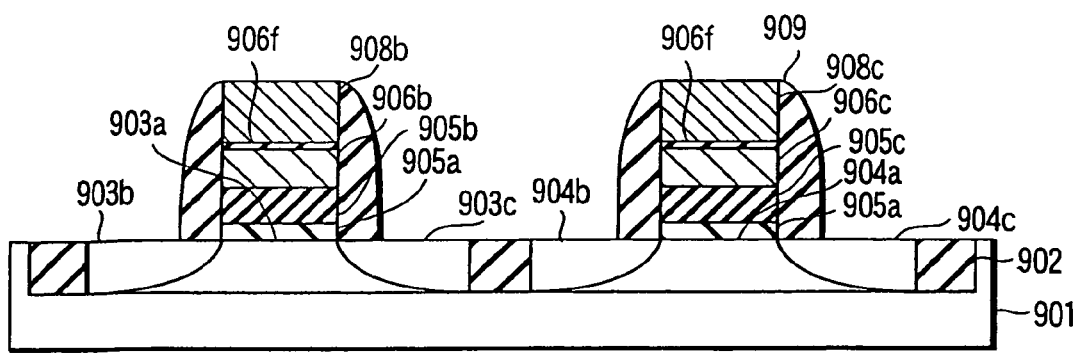
F I G. 42

SEMICONDUCTOR DEVICE AND METHOD OF MANUFACTURING THE SAME

CROSS-REFERENCE TO RELATED APPLICATIONS

This application is a continuation of application Ser. No. 12/081,824, filed Apr. 22, 2008, now U.S. Pat. No. 7,687,869 which is a division of application Ser. No. 10/738,049, filed Dec. 18, 2003, now U.S. Pat. No. 7,375,403 which is based upon and claims the benefit of priority from the prior Japanese Patent Application No. 2003-335966, filed Sep. 26, 2003, the entire contents of all of which are incorporated herein by reference.

BACKGROUND OF THE INVENTION

1. Field of the Invention

This invention relates to a semiconductor device which has a high dielectric constant thin film as an insulating film used for a gate insulating film or the like and a metallic material as an electrode used for a gate electrode or the like and to a method of manufacturing the semiconductor device.

2. Description of the Related Art

As LSIs have recently been getting much denser and much faster, elements in LSIs have been miniaturized more. With the further miniaturization, there have been demands for silicon oxide ($SiO_2$) films to be made still thinner in a capacitor and/or a transistor as component elements in a MOS structure. When the thickness of a $SiO_2$ film becomes as thin as 3 nm or less, electrons start to flow through a direct tunneling under an electric field where the device operates, which causes the problem of increasing leakage current and therefore increasing the power consumption of the device and other problems.

To overcome the problems, a next-generation gate insulating film replaceable with the $SiO_2$ film has been desired and a high dielectric constant film has been attracting attention. The reason is that a high dielectric constant film with the same capacitance as that of a $SiO_2$ film is thicker than the latter. Making the insulating film thicker makes it possible to decrease the probability that electrons will tunnel through the insulating film or to suppress tunnel current to a low level.

As a high dielectric gate insulating film replaceable with $SiO_2$, hafnium (Hf)-silicate has been nominated. In addition, to suppress the depletion in the gate electrode, it is desirable that the Hf-silicate should be combined with a metal gate electrode for use.

However, it is difficult to produce a CMOS device using two types of metals with different work functions as a gate electrode by a conventional manufacturing method. The two types of work functions are preferably equivalent to Fermi levels in widely-used poly-crystalline Si gate electrodes of the n-type and p-type MOSFET. In addition, one known method of fabricating a CMOS device using one type of metal as a gate electrode is to produce the difference between work functions by implanting boron (B), phosphorus (P), arsenic (As) ions, or the like into nickel silicide ($NiSi_2$), followed by heat treatment. However, the difference was about 0.5 V at most and therefore a sufficient value could not be obtained from the viewpoint of circuit design.

Jpn. Pat. Appln. KOKAI Publication No. 2002-280461 has disclosed a method of introducing divalent or tetravalent metal impurities into a trivalent metal oxide to produce fixed charges and thereby causing a flat band voltage ($V_{fb}$) shift. As a result of experiments, in a system using aluminum (Al) as trivalent metal and Hf as tetravalent metal, the TDDB (time-dependent dielectric breakdown) deteriorated. The result has shown that the reliability deterioration was revealed when the introduced impurities were metals.

With the method of producing the difference between work functions in the gate electrode by implanting B, P, As ions, or the like into nickel silicide and then heat-treating the silicide, the difference in work functions between them was about 0.5 V at most and a sufficient value could not be obtained from the viewpoint of circuit design (e.g., see reference: J. Kedzierski et al., IEDM Tech., Dig. (2002) 247.

BRIEF SUMMARY OF THE INVENTION

According to an aspect of the invention, there is provided a semiconductor device comprising: a semiconductor substrate; a gate insulating film which is composed of a material whose main component is a tetravalent metal oxide, a mixture of a tetravalent metal oxide and $SiO_2$, or a mixture of a tetravalent metal oxide and oxysilicon nitride (SiON) and which containing B when it is in an nMOS structure on the semiconductor substrate or containing at least one of P and As when it is in a pMOS structure on the semi-conductor substrate; and a gate electrode made of a metal having a work function of 4 eV to 5.5 eV.

According to another aspect of the invention, there is provided a semiconductor device manufacturing method comprising: forming a channel region in a semiconductor substrate; forming on the channel region a gate insulating film which is composed of a material whose main component is a tetravalent metal oxide, a mixture of a tetravalent metal oxide and $SiO_2$, or a mixture of a tetravalent metal oxide and SiON; introducing B into the gate insulating film when the gate insulating film is in an nMOS structure on the semiconductor substrate or introducing at least one of P and As into the gate insulating film when the gate insulating film is in a pMOS structure; and forming on the gate insulating film a gate electrode made of a metal having a work function of 4 eV to 5.5 eV.

BRIEF DESCRIPTION OF THE SEVERAL VIEWS OF THE DRAWING

FIG. 21 is a sectional view showing a process of manufacturing the semiconductor device of the third embodiment;

FIG. 22 is a sectional view showing a process of manufacturing the semiconductor device of the third embodiment;

FIG. 23 is a sectional view showing a process of manufacturing the semiconductor device of the third embodiment;

FIG. 24 is a sectional view showing a process of manufacturing a semiconductor device according to a fourth embodiment of the present invention;

FIG. 25 is a sectional view showing a process of manufacturing the semiconductor device of the fourth embodiment;

FIG. 26 is a sectional view showing a process of manufacturing the semiconductor device of the fourth embodiment;

FIG. 27 is a sectional view showing a process of manufacturing the semiconductor device of the fourth embodiment;

FIG. 28 is a sectional view showing a process of manufacturing the semiconductor device of the fourth embodiment;

FIGS. 32A and 32B are sectional views of an nMOS structure showing a basic structure of a semiconductor device according to a modification of each of the first to fourth embodiments;

FIG. 33 is a sectional view showing a process of manufacturing a semiconductor device according to a fifth embodiment of the present invention;

FIG. 34 is a sectional view showing a process of manufacturing the semiconductor device of the fifth embodiment;

FIG. 39 is a sectional view showing a process of manufacturing the semiconductor device of the fifth embodiment;

FIG. 40 is a sectional view showing a process of manufacturing the semiconductor device of the fifth embodiment;

FIG. 41 is a sectional view showing a process of manufacturing the semiconductor device of the fifth embodiment; and FIG. 42 is a sectional view showing a process of manufacturing the semiconductor device of the fifth embodiment.

DETAILED DESCRIPTION OF THE INVENTION

Hereinafter, referring to the accompanying drawings, embodiments of the present invention will be explained.

Figure 1A:
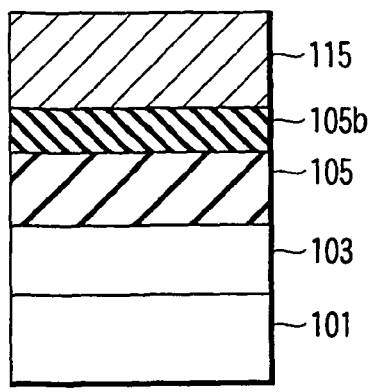
FIGS. 1A and 1B are sectional views of a MOS structure showing a basic structure of a semiconductor device according to an embodiment of the present invention and FIGS. 1C and 1D are basic characteristic diagrams of the semiconductor device.
Figure 1B:
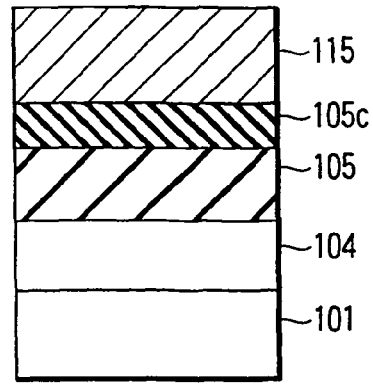

FIGS. 1A and 1B are sectional views of a MOS structure showing a basic structure of a semiconductor device according to an embodiment of the present invention. FIG. 1A shows the structure of an nMOS (n-channel MOSFET) and FIG. 1B shows the structure of a pMOS (p-channel MOSFET). Although each of FIGS. 1A and 1B shows a MOS capacitor structure, providing the MOS capacitor structure with a source and a drain enables the structure to be applied to a transistor.

In a surface of semiconductor substrate 101 made of Si or the like, a channel region 103 or 104 is formed. On the channel region, a gate insulating film 105 made of Hf-silicate (HfSiO) or the like is formed. On the gate insulating film 105, a metal gate electrode 115 is formed. In the electrode side of the gate insulating film 105, a layer 105b with positive fixed charges is formed in the nMOS and a layer 105c with negative fixed charges is formed in the pMOS.

The gate insulating film 105 contains at least one of metal oxide, metal nitride, and metal oxynitride. For example, the gate insulating film 105 contains a material whose main component is tetravalent metal oxide, a mixture of tetravalent metal oxide and $SiO_2$ ($(MO_2)_x(SiO_2)_{1-x}$: $0<x\leq1$, where M is tetravalent metal), or a mixture of tetravalent metal and SiON. The metal includes titanium (Ti), zirconium (Zr), and Hf. For example, the material contains Hf-silicate composed of Hf, Si, O, and N. In addition, the material may contain Zr-silicate (ZrSiO), ZrSiON, HfZrSiO, HfZrSiON, HfAlO, HfAlON, HfZrAlO, HfZrAlON, HfSiAlON, or HfZrSiON. There is a possibility that the inclusion of trivalent metal Al will permit fixed charges to be induced. However, the fixed charge effect of the gate insulating film will not be lost completely even in the presence of fixed charge caused by other elements, since the embodiment is characterized by containing tetravalent metals Hf, Zr and trivalent nonmetals B, P, As. As a film forming method for, for example, Hf-silicate as a gate insulating film, any one of vacuum evaporation, sputtering techniques, zol-gel techniques, laser abrasion techniques, and CVD techniques may be used. For instance, in the CVD techniques, the film can be formed by supplying TEOS (Si$(OC_2H_5)_4$), HTB (Hf$(OC(CH_3)_3)_4$), and $O_2$ simultaneously at 600° C. and 1 Toor. The composition ratio Hf/(Hf+Si) can be controlled by adjusting the amount of TEOS and HTB supplied. The film thickness can be controlled by adjusting the supply time. When the Hf/(Hf+Si) ratio in the vicinity of the electrode of the gate insulating film is 1% or more, the effect of a shift in the threshold voltage by fixed charges can be expected sufficiently. Thereafter, heat treatment is performed for five minutes in an atmosphere of $NH_3$ at 800° C. and 100 Torr, which enables N to be introduced into Hf-silicate.

The material for the metal gate electrode 115 may be made not only of a single type of metal, such as Fe, Co, Ni, Ti, Hf, or Zr but also of an alloy of these metals. As long as the material has a metallic electrical characteristic, it may contain Si, Ge, N, B, P, As, or the like. For instance, the material may be such silicide as $HfSi_2$ or $CoSi_2$ or such a nitride as TiN. For example, when the gate insulating film is Hf-silicate, it is desirable that such metallic material as HfSiN should be selected as a material common to the gate electrode of both structures to stabilize the characteristics, taking into account the diffusion of the gate electrode material and the gate insulating film material during the heat treatment in the LSI manufacturing processes.

When the fixed charge layers 105b, 105c are formed in the gate insulating films 105, B, P, As, or the like may be used as additional elements. Furthermore, elements that produce positive fixed charges include Al, Ga, In, and Ti in the 3B group to which B belongs and elements that produce negative charges include N, Sb, and Bi in the 5B group to which P and As belong. Other materials can produce a similar effect, as long as they enable fixed charges to be produced in the gate insulating films.

Figure 1C:
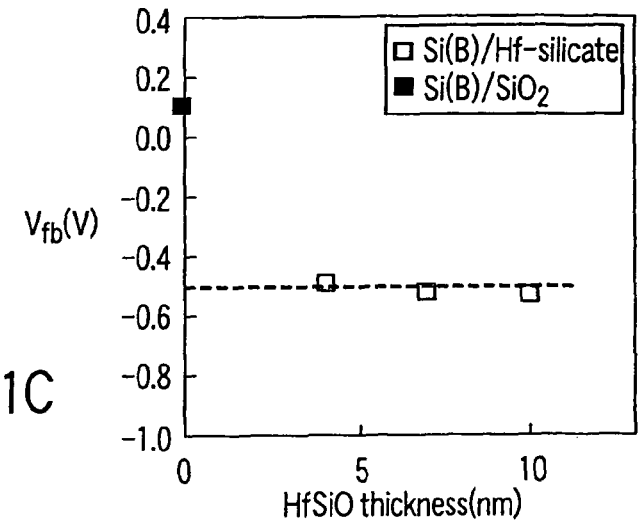
Figure 1D:
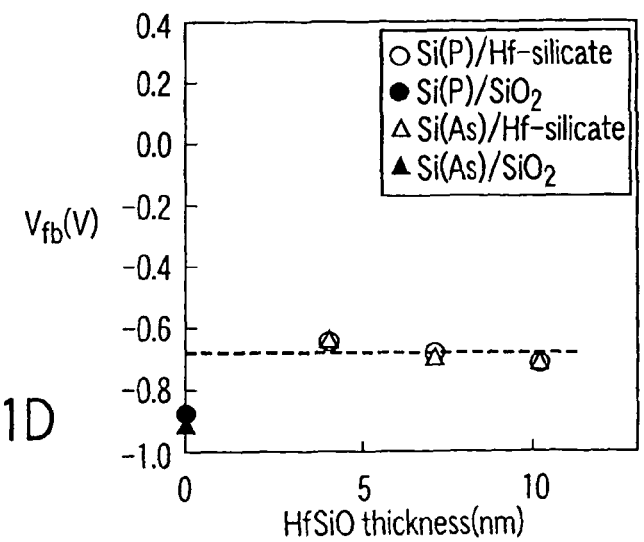

FIGS. 1C and 1D show the basic characteristics of semiconductor devices according to the embodiment. FIG. 1C shows flat band voltages $V_{fb}$ obtained when Hf-silicate films with a film thickness of 4 nm, 7 nm, and 10 nm in the composition ratio Hf/(Hf+Si)=30% were formed as a gate insulating film on an n-type Si substrate and polycrystalline Si was used as a gate electrode. FIG. 1D shows flat band voltages $V_{fb}$ in the case of a p-type Si substrate under the same conditions. FIGS. 1C and 1D also show a case where $SiO_2$ was produced in the form of a gate insulating film in the same manufacturing processes as reference. The $V_{fb}$ of Hf-silicate depends slightly on the film thickness. The difference between the $V_{fb}$ of Hf-silicate and the $V_{fb}$ of $SiO_2$ indicates existence of fixed charges in the vicinity of the Si gate electrode in the Hf-silicate layer.

In the case of B in FIG. 1C, $V_{fb}$ is shifted about 0.6 to 0.7 V in the negative direction, producing positive fixed charges. In the case of P and As in FIG. 1D, $V_{fb}$ is shifted about 0.2 to 0.3 V in the positive direction, producing negative fixed charges. With this composition, the threshold values of nMOS and pMOS will be balanced well, when such a material is selected as the gate electrode which has a work function shifted about 0.2 V toward the valence band from the mid-gap of the Si substrate. In the embodiment, the gate electrode is made of metal with a work function of, for example, 4 to 5.5 eV.

Since the amount of fixed charges depend on the composition of the gate insulating film and the amount of B, P, and As introduced therein, for example, the Hf/(Hf+Si) ratio may be increased when more fixed charges are needed.

In the embodiment, before the formation of the insulating film, a thin film can be formed for example, an SiON layer of about 0.6 nm thick, on the underlying substrate (e.g., Si) to prevent B, P, and As diffusing from the gate insulating film to the substrate. To form fixed charges sufficiently, as many impurities as possible should be added to the gate insulating film. However, the change of the impurity concentration in the channel region can cause variations in the threshold values of nMOS and pMOS or make the device design complicated. To avoid the problems, the thin film, e.g. SiON, is used to prevent B, P, and As diffusing into the substrate during heat treatment in the LSI manufacturing processes.

Moreover, the embodiment also includes a process of diffusing B from the upper side of the insulating film containing Hf(Zr) in the nMOS and at least one of P and As from the upper side of the insulating film in the pMOS and a process of forming a metal gate electrode (including silicide or nitride) on the insulating film.

FIGS. 2 to 11 are sectional views showing the processes of manufacturing a semiconductor device according to a first embodiment of the present invention. Although FIGS. 2 to 11 shows the embodiment related to a pair of nMOS and pMOS, they are not necessarily arranged side by side on a single substrate. Of course, the first embodiment may be applied to an SOI (Silicon On Insulator) MOSFET and a vertical MOS (with a channel perpendicular to the substrate surface and electrons and holes moving along the channel, or perpendicularly to the substrate surface).

Figure 2:
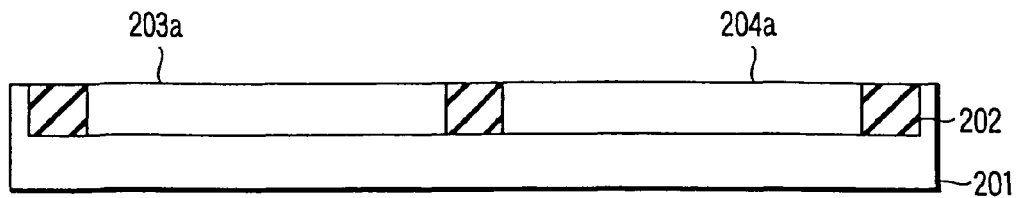
FIG. 2 is a sectional view showing a process of manufacturing a semiconductor device according to a first embodiment of the present invention.

First, as shown in FIG. 2, after an $SiO_2$ film 202 for trench isolation is formed in an Si substrate 201, the substrate 201 is covered with a resist in which openings are selectively made only on the device regions by photolithography, thereby forming channel regions 203a, 204a into which necessary dopant has been implanted.

Figure 3:
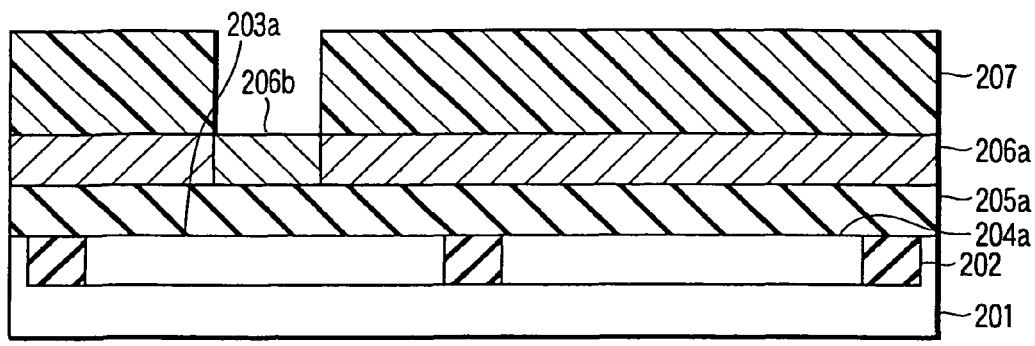
FIG. 3 is a sectional view showing a process of manufacturing the semiconductor device of the first embodiment.

Next, as shown in FIG. 3, an Hf-silicate layer 205a is formed as a gate insulating film. TEOS ($Si(OC_2H_5)_4$), HTB ($Hf(OC(CH_3)_3)_4$), and $O_2$ are supplied simultaneously at 600° C. and 1 Toor by CVD techniques, which enables Hf-silicate to be deposited to a thickness of about 4 nm with Hf/(Hf+Si) ratio=30%.

Figure 4:
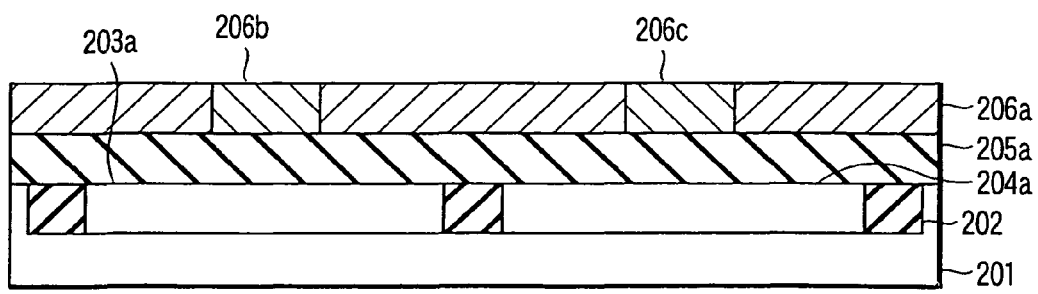
FIG. 4 is a sectional view showing a process of manufacturing the semiconductor device of the first embodiment.

Next, B, P, or As is introduced into the electrode side of the Hf-silicate layer 205a. For example, this is done as follows. After the Hf-silicate film is formed, an Si layer 206a is deposited on the Hf-silicate layer 205a to a thickness of 50 nm at 620° C. in a mixed gas of $SiH_4$, $N_2$, and $H_2$. The layer 206a is covered with a resist 207 in which openings are selectively made only on the device regions by photolithography, which enables B ions to be selectively implanted into a Si layer 206b on the region to become the gate insulating film in the nMOS and at least one of P and As ions to be selectively implanted into a Si layer 206c on the region to become the gate insulating film in the pMOS as shown in FIG. 4.

Figure 5:
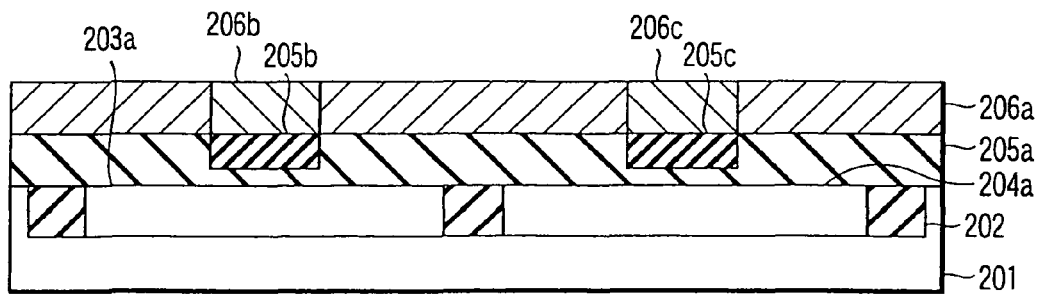
FIG. 5 is a sectional view showing a process of manufacturing the semiconductor device of the first embodiment.

Then, as shown in FIG. 5, a rapid thermal annealing (RTA: short-time high-temperature annealing) is performed, thereby diffusing B, P, or As into the Hf-silicate film. The acceleration voltage in the ion implantation should be selected at a level that does no damage to the Hf-silicate layer during implantation. For instance, B ions are implanted at about 2 keV, P ions are implanted at about 5 keV, and As ions are implanted at about 20 keV. The dose amount is adjusted so as to be about $1 \times 10^{20}$ cm$^{-3}$ or $1 \times 10^{13}$ cm$^{-2}$ in the vicinity of the interface between the Hf-silicate layer 205a and Si layer 206b and of the interface between the Hf-silicate layer 205a and Si layer 206c during the diffusion to be carried out next. Therefore, the dose amount depends on the diffusion condition. For instance, diffusion is performed by heat treatment for about three seconds at 1000° C. with a dose of $1 \times 10^{15}$ cm$^{-2}$. As a result, in the vicinity of the electrode of the Hf-silicate layer 205a, a layer 205b with positive charges is formed in the nMOS and a layer 205c with negative charges is formed in the pMOS. The Si layers 206b, 206c need not be adjusted to the gate length. If the diffusion time is made longer and more B, P, or As are implanted, the Si layers 206b, 206c may have a shorter length than the gate length. If the uniformity of the fixed charge layers 205b, 205c along the gate length direction is taken seriously, the Si layers 206b, 206c may have a longer length than the gate length.

Figure 6:
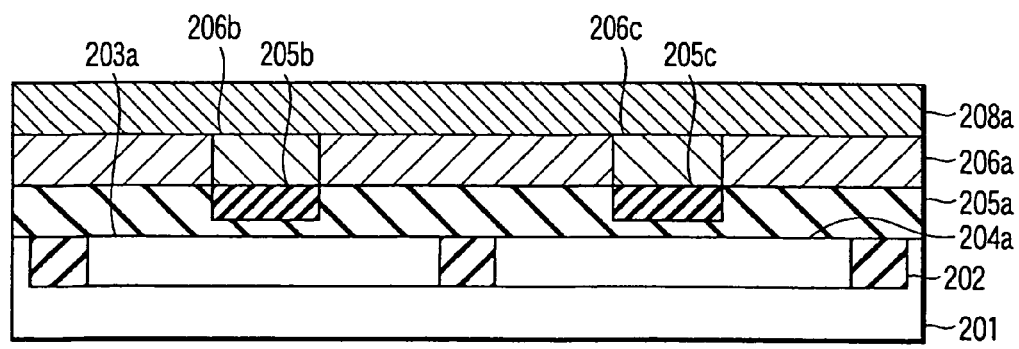
FIG. 6 is a sectional view showing a process of manufacturing the semiconductor device of the first embodiment.
Figure 7:
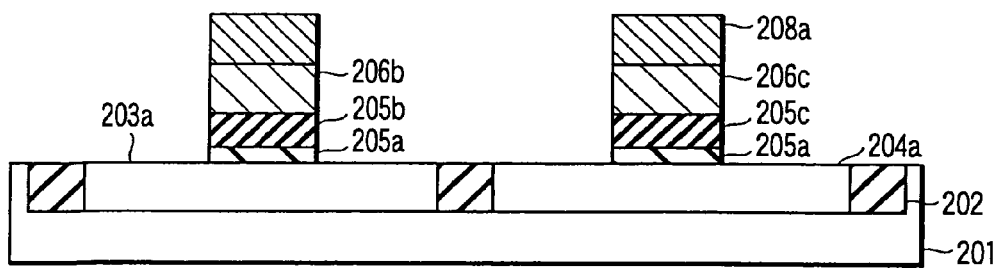
FIG. 7 is a sectional view showing a process of manufacturing the semiconductor device of the first embodiment.

Next, as shown in FIG. 6, an Si layer 208a is deposited to a thickness of 100 nm at 620° C. in a mixed gas of $SiH_4$, $N_2$, and $H_2$. Then, as shown in FIG. 7, with a resist patterned by photolithography techniques, the Si layers 206a, 208a are etched into a gate electrode shape by a reactive ion etching (RIE). Thereafter, using a solution containing HF, the Hf-silicate layer 205a is processed.

Figure 8:
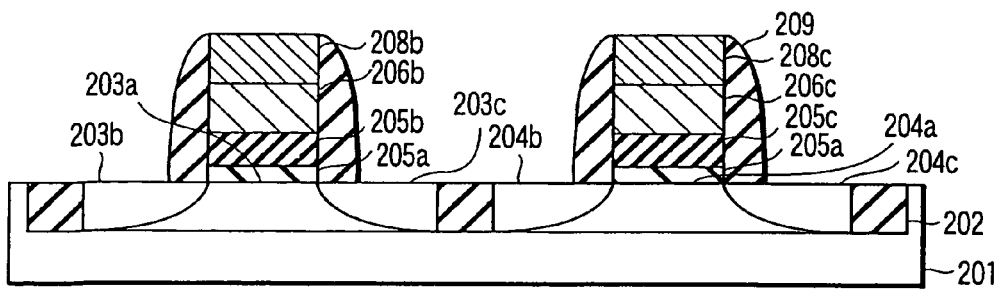
FIG. 8 is a sectional view showing a process of manufacturing the semiconductor device of the first embodiment.

Next, as shown in FIG. 8, after an $SiO_2$ film is deposited on the entire surface, the entire surface is etched back by RIE, thereby forming a gate sidewall $SiO_2$ film 209 with a thickness of 5 nm. Then, with the Si layers 208b, 208c and the sidewall $SiO_2$ layer 209 as a mask, at least one of P and As is implanted with a dose of $1 \times 10^{15}$ cm$^{-2}$ at an acceleration voltage of 20 keV in the nMOS and B is implanted with a dose of $1\times10^{15}$ cm$^{-2}$ at an acceleration voltage of 2 keV in the pMOS.

Figure 9:
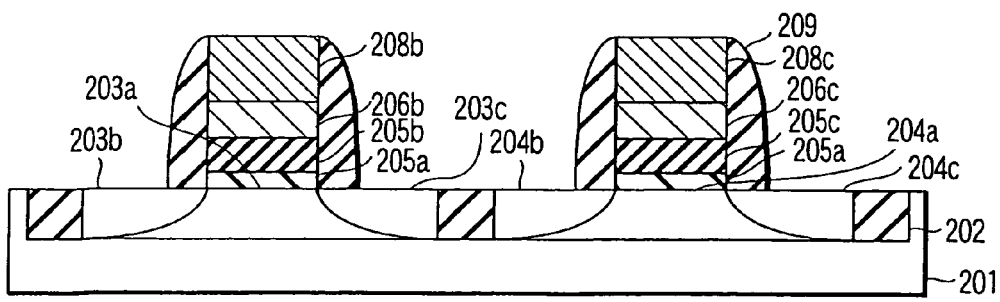
FIG. 9 is a sectional view showing a process of manufacturing the semiconductor device of the first embodiment.

Next, as shown in FIG. 9, RTA is performed for one second at 1000° C., thereby forming sources and drains 203b, 203c, 204b, 204c. At this time, to prevent the effect of the fixed charges in the fixed charge layer 205b region from being lost due to the diffusion of P or As from the Si layer 208b or the dissociation of B from the fixed charge layer 205b through the Si layer 206b, it is desirable that RTA should be performed as short as possible. Similarly, attention should be given to the fixed charges in the fixed charge layer 205c region because of the diffusion of B from the Si layer 208c or the dissociation of P or As from the fixed charge layer 205c through the Si layer 206c.

Figure 10:
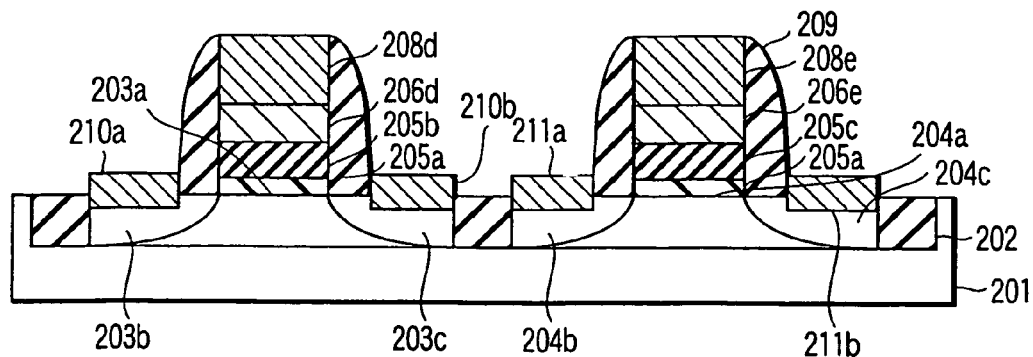
FIG. 10 is a sectional view showing a process of manufacturing the semiconductor device of the first embodiment.

Next, as shown in FIG. 10, after Co is deposited, CoSi$_2$ layers 210a, 210b, 211a, 211b are formed on the sources and drains by carrying out heat treatment and removing the remaining Co. At the same time, the Si layers 206b, 206c, 208b, 208c are turned into silicide, thereby forming metal gate electrodes 206d, 206e, 208d, 208e.

Figure 11:
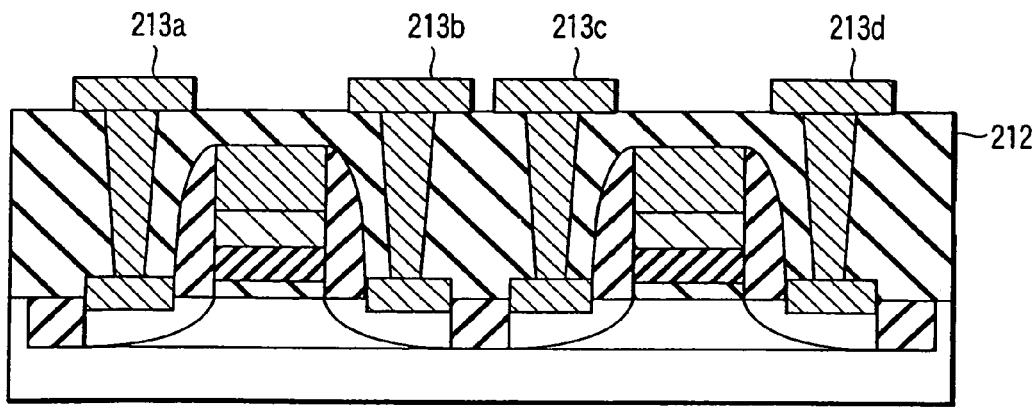
FIG. 11 is a sectional view showing a process of manufacturing the semiconductor device of the first embodiment.

Next, as shown in FIG. 11, an interval insulating film SiO$_2$ layer 212 using TEOS or the like is deposited on the entire surface. Contact holes are made so as to connect to the sources and drains. Then, Al/TiN/Ti or Cu/TiN/Ti wiring layers 213a, 213b, 213c, 213d are formed.

From this step on, wiring processes for a second and later layers are carried out, which completes the LSI.

FIGS. 12 to 15 are sectional views showing the processes of manufacturing a semiconductor device according to a second embodiment of the present invention.

Figure 12:
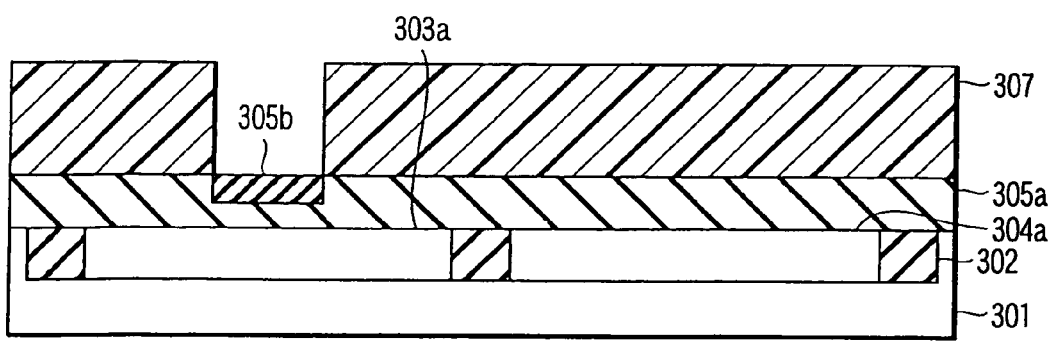
FIG. 12 is a sectional view showing a process of manufacturing a semiconductor device according to a second embodiment of the present invention.

First, as shown in FIG. 12, on an Si substrate 301, isolations 302, channel regions 303a, 304a, and a gate insulating film (Hf-silicate layer) 305a are formed. The method is the same as in the first embodiment.

Next, B, P, As, or the like is introduced into the electrode side of the gate insulating film 305a. The gate insulating film 305a is covered with a resist 307 in which openings are selectively made in the regions to eventually become gate insulating film parts by photolithography. Next, in the nMOS, B is selectively implanted with a dose of $1\times10^{13}$ cm$^{-2}$. In the pMOS, at least one of P or As is selectively implanted with a dose of $1\times10^{13}$ cm$^{-2}$. The acceleration voltage is low so as to prevent the Hf-silicate layer from being damaged during implantation. For example, B is implanted at about 200 eV, P is implanted at about 500 eV, and As is implanted at about 2 keV. In addition, thermal evaporation deposition techniques may be used. Then, for annihilation of the damage, an annealing is done at 800° C. for 30 seconds in an atmosphere containing O$_2$.

Figure 13:
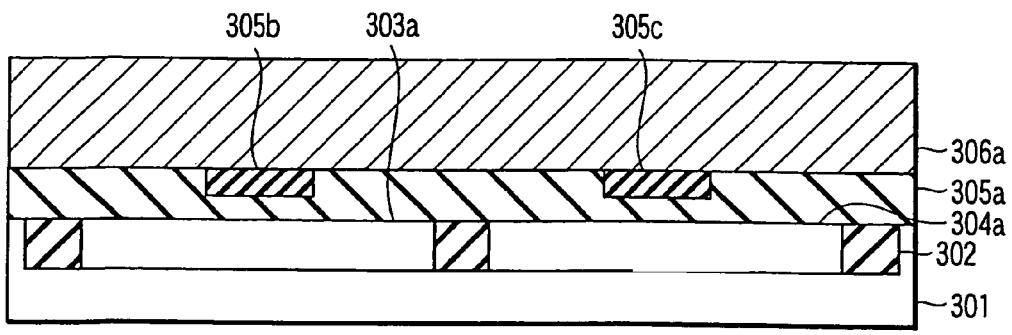
FIG. 13 is a sectional view showing a process of manufacturing the semiconductor device of the second embodiment.
Figure 14:
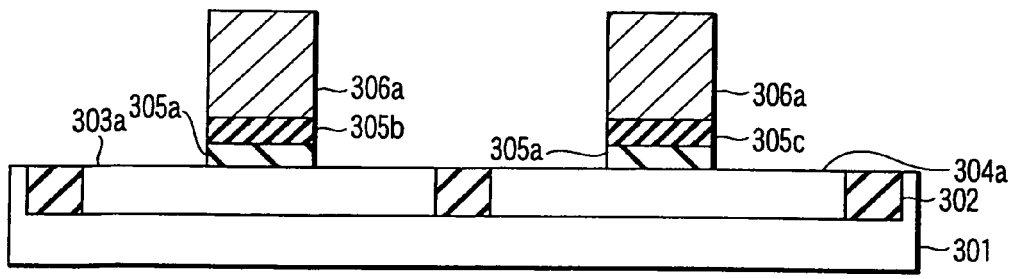
FIG. 14 is a sectional view showing a process of manufacturing the semiconductor device of the second embodiment.

Next, as shown in FIG. 13, an Si layer 306a is deposited to a thickness of 150 nm at 620° C. in a mixed gas of SiH$_4$, N$_2$, and H$_2$. Then, as shown in FIG. 14, with a resist patterned by photolithography as a mask, the Si layer 306a is processed into a gate electrode shape by RIE. Thereafter, using a solution containing HF, the Hf-silicate layer 305a is processed.

Figure 15:
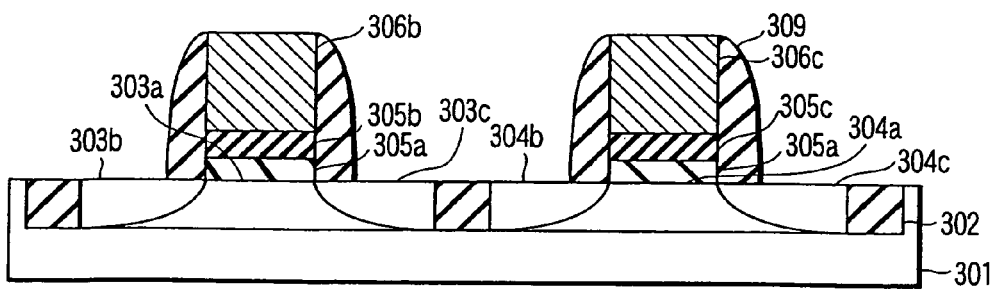
FIG. 15 is a sectional view showing a process of manufacturing the semiconductor device of the second embodiment.

Next, as shown in FIG. 15, after another SiO$_2$ film is deposited on the entire surface, the entire surface is etched back by RIE, thereby forming a gate sidewall SiO$_2$ film 309 with a thickness of 5 nm. Then, with the Si layers 306b, 306c and the sidewall SiO$_2$ layer 309 as a mask, As is implanted with a dose of $1\times10^{15}$ cm$^{-2}$ at an acceleration voltage of 20 keV in the nMOS and B is implanted with a dose of $1\times10^{15}$ cm$^{-2}$ at an acceleration voltage of 2 keV in the pMOS.

From this step on, the formation of the sources and drains by one second of RTA at 1000° C., the formation of a CoSi$_2$ layer, wiring processes, and others are the same as in the first embodiment.

FIGS. 16 to 23 are sectional views showing the processes of manufacturing a semiconductor device according to a third embodiment of the present invention.

Figure 16:
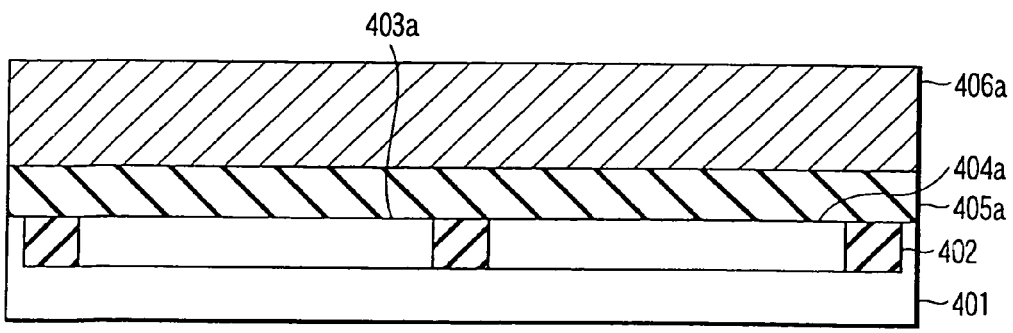
FIG. 16 is a sectional view showing a process of manufacturing a semiconductor device according to a third embodiment of the present invention.

First, as shown in FIG. 16, on an Si substrate 401, isolations 402, channel regions 403a, 404a, and a gate insulating film (Hf-silicate film) 405a are formed. The method is the same as in the first embodiment. Next, an Si layer 406a is deposited to a thickness of 150 nm at 620° C. in a mixed gas of SiH$_4$, N$_2$, and H$_2$.

Figure 17:
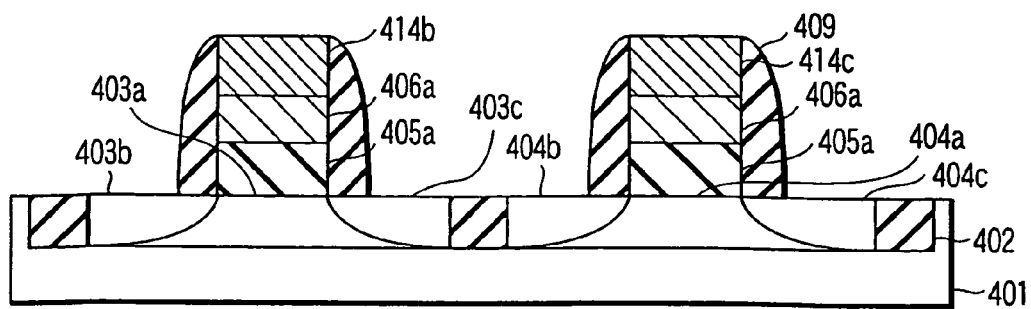
FIG. 17 is a sectional view showing a process of manufacturing the semiconductor device of the third embodiment.

Then, as shown in FIG. 17, with a resist patterned by photolithography as a mask, the Si layer 406a is processed into a gate electrode shape by RIE. Thereafter, using a solution containing HF, the Hf-silicate layer 405a is processed.

After an SiO$_2$ film is deposited on the entire surface, the entire surface is etched back by RIE, thereby forming a gate sidewall SiO$_2$ film 409 with a thickness of 5 nm. Then, with the Si layer 406a and the sidewall SiO$_2$ layer 409 as a mask, As is implanted with a dose of $1\times10^{15}$ cm$^{-2}$ at an acceleration voltage of 20 keV in the nMOS and B is implanted with a dose of $1\times10^{15}$ cm$^{-2}$ at an acceleration voltage of 2 keV in the pMOS.

Figure 18:
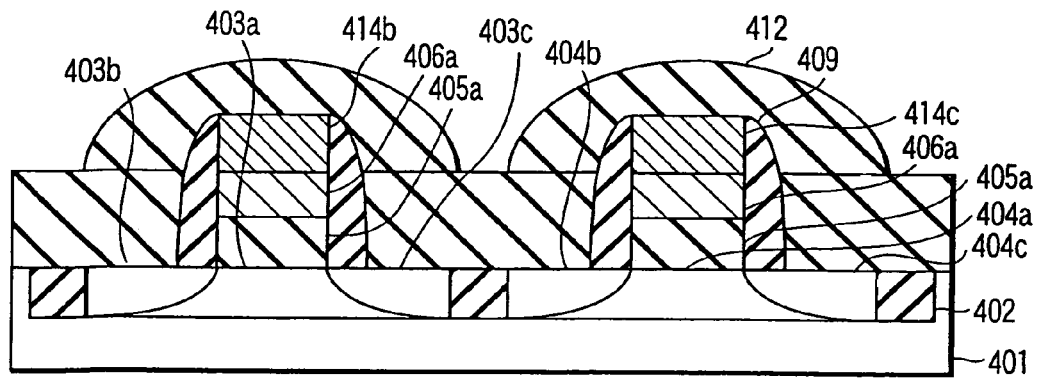
FIG. 18 is a sectional view showing a process of manufacturing the semiconductor device of the third embodiment.
Figure 19:
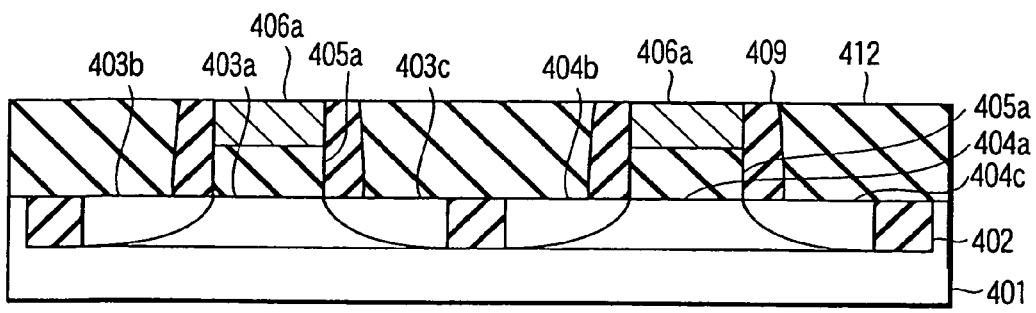
FIG. 19 is a sectional view showing a process of manufacturing the semiconductor device of the third embodiment.
Figure 20:
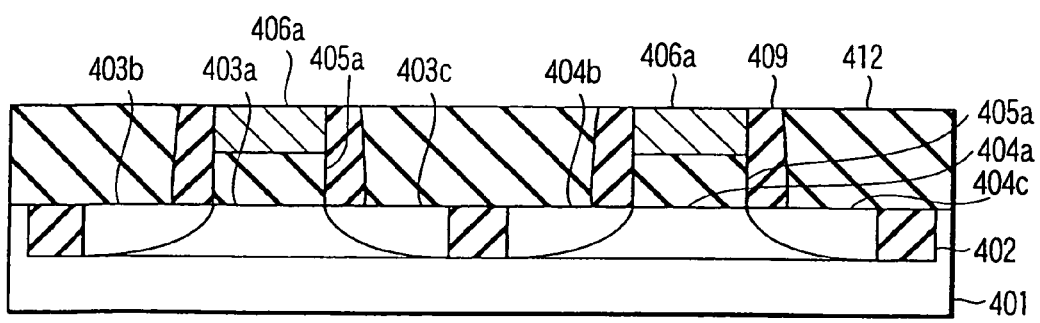
FIG. 20 is a sectional view showing a process of manufacturing the semiconductor device of the third embodiment.

Next, as shown in FIG. 18, an interlevel insulating film SiO$_2$ 412 using TEOS or the like is deposited on the entire surface. Then, as shown in FIG. 19, not only the SiO$_2$ layer 412 but also the Si layers 414b, 414c are removed by CMP. Then, as shown in FIG. 20, the resulting film is covered with a resist in which openings are selectively made only on the device regions by photolithography. In this state, B is selectively implanted into Si on the region which will eventually become a gate insulating film in the nMOS and at least one of P and As is selectively implanted in the pMOS.

Then, as shown in FIG. 21, RTA is performed, thereby diffusing B, P, or As into the Hf-silicate. The acceleration voltage is at a level that does no damage to the Hf-silicate layer during implantation. For instance, B ions are implanted at about 2 keV, P ions are implanted at about 5 keV, and As ions are implanted at about 20 keV. The dose amount is adjusted so as to be about $1\times10^{20}$ cm$^{-3}$ or $1\times10^{13}$ cm$^{-2}$ in the vicinity of the interface between the Hf-silicate layer 405a and Si layer 406b and of the interface between the Hf-silicate layer 405a and Si layer 406c during the diffusion to be carried out next. Therefore, the dose amount depends on the diffusion condition. For instance, diffusion is performed by heat treatment for about three seconds at 1000° C. with a dose of $1\times10^{15}$ cm$^{-2}$. As a result, in the vicinity of the electrode of the Hf-silicate layer 405a, a layer 405b with positive charges is formed in the nMOS and a layer 405c with negative charges is formed in the pMOS.

Next, as shown in FIG. 22, the Si layers 406b, 406c are removed by CDE. Then, as shown in FIG. 23, after TiN is deposited on the entire surface by sputtering techniques, the deposited TiN is covered with a resist processed into a gate electrode shape by photolithography and then is etched with an H$_2$O$_2$-contained solution. This completes a metal gate electrode 415.

From this step on, the subsequent processes, including wiring processes, are the same as in the first embodiment.

FIGS. 24 to 30 are sectional views showing the processes of manufacturing a semiconductor device according to a fourth embodiment of the present invention.

First, the gate insulating film of each of an nMOS and a pMOS is provided with a fixed charge layer by damascene techniques as follows. In an Si substrate 501, isolations 502, channel regions 503a, 504a are formed. The method is the same as in the first embodiment. Next, an $SiO_2$ layer 516 is formed to a thickness of 5 nm at 800° C. in an $O_2$-containing atmosphere. The $SiO_2$ layer 516 may be formed by CVD techniques using TEOS. Alternatively, the Hf-silicate or the like may be substituted for the $SiO_2$ layer 516. Then, an Si layer 506a is deposited to a thickness of 150 nm at 620° C. in a mixed gas of $SiH_4$, $N_2$, and $H_2$.

Next, as shown in FIG. 25, with a resist patterned by photolithography as a mask, the Si layer 506a is processed into a gate electrode shape by RIE. Thereafter, using a solution containing HF, the $SiO_2$ layer 516 is processed.

After another $SiO_2$ film is deposited on the entire surface, the entire surface is etched back by RIE, thereby forming a gate sidewall $SiO_2$ film 509 with a thickness of 5 nm. Then, with the Si layer 506a and the sidewall $SiO_2$ layer 509 as a mask, As is implanted with a dose of $1 \times 10^{13}$ $cm^{-2}$ at an acceleration voltage of 20 keV in the nMOS and B is implanted with a dose of $1 \times 10^{13}$ $cm^{-2}$ at an acceleration voltage of 2 keV in the pMOS. A source and a drain are formed by RTA for three seconds at 1000° C.

Next, as shown in FIG. 26, an interlevel insulating film $SiO_2$ 512 using TEOS or the like is deposited on the entire surface. Then, the surfaces of the Si layers 508b, 508c are exposed by CMP. Then, as shown in FIG. 27, after the Si layers 508b, 508c are removed by RIE, the $SiO_2$ layer 512 is removed with a solution containing HF.

Figure 29:
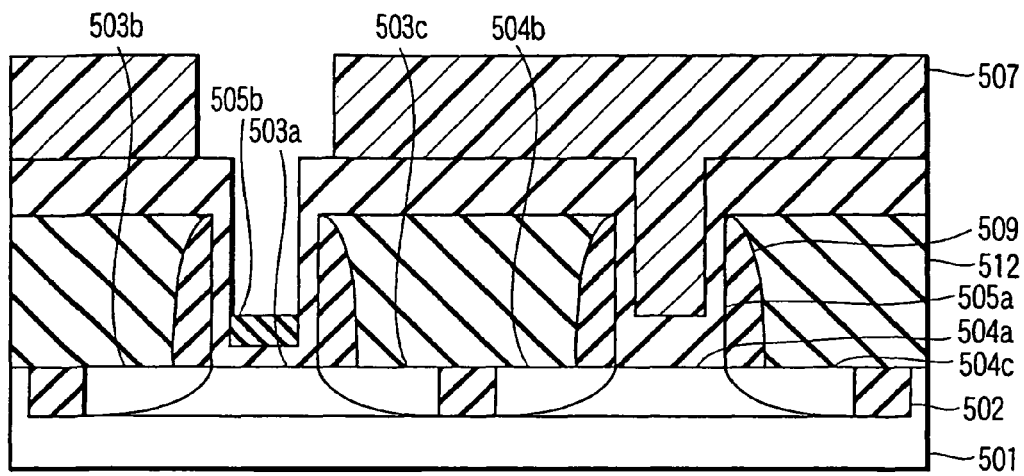
FIG. 29 is a sectional view showing a process of manufacturing the semiconductor device of the fourth embodiment.

Next, as shown in FIG. 28, a gate insulating film (Hf-silicate layer) 505a is formed by the aforementioned method. Then, as shown in FIG. 29, the gate insulating film is covered with a resist in which openings are selectively made in the gate electrode regions by photolithography. In this state, B is selectively implanted into Si on the region which will eventually become a gate insulating film in the nMOS and at least one of P and As is selectively implanted in the pMOS. The regions in which openings are made are not necessarily limited to the gate electrode region and may be made larger than the electrode regions by use of the regions where the interlevel insulating film $SiO_2$ 512 is present, which prevents misalignment.

Figure 30:
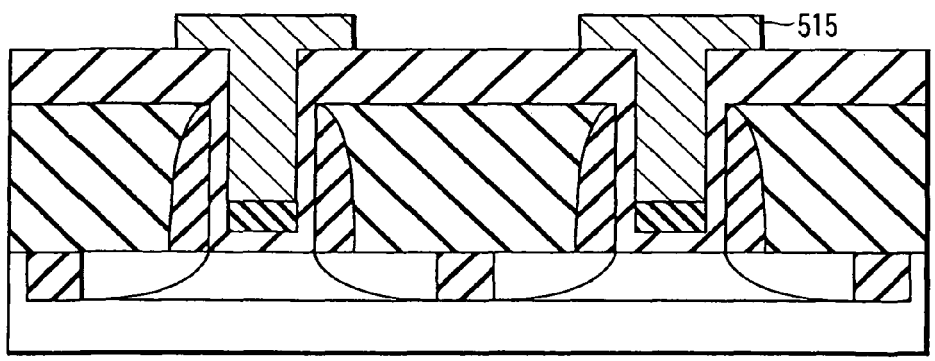
FIG. 30 is a sectional view showing a process of manufacturing the semiconductor device of the fourth embodiment.

Next, as shown in FIG. 30, after TiN is deposited on the entire surface by sputtering techniques, the deposited TiN is covered with a resist processed into a gate electrode shape by photolithography and then is etched with an $H_2O_2$-contained solution. This completes a metal gate electrode 515.

From this step on, the subsequent processes, including wiring processes, are the same as in the first embodiment.

FIGS. 33 to 42 are sectional views showing the processes of manufacturing a semiconductor device according to a fifth embodiment of the present invention.

First, as shown in FIG. 33, on an Si substrate 901, isolations 902, channel regions 903a, 904a, and a gate insulating film 905a are formed. The method is the same as in the first embodiment.

Next, an Si layer 906a is deposited to a thickness of 150 nm at 620° C. in a mixed gas of $SiH_4$, $N_2$, and $H_2$. Then, the Si layer 906a is covered with a resist in which openings are selectively made only on the device regions by photolithography. In this state, B is selectively implanted into Si on the region which will eventually become a gate insulating film in the nMOS and at least one of P and As is selectively implanted in the pMOS. Under the conditions that the amount of dopant reaching the channel region is less than the dopant concentration in the channel region, the acceleration voltage at that time should be set as high as possible so that the dopant gets closer to the gate insulating film (Hf-silicate layer) 905a. For example, As is implanted with a dose of $1 \times 10^{15}$ $cm^{-2}$ at an acceleration voltage of 50 keV and B is implanted with a dose of $1 \times 10^{15}$ $cm^{-2}$ at an acceleration voltage of 8 keV.

Figure 35:
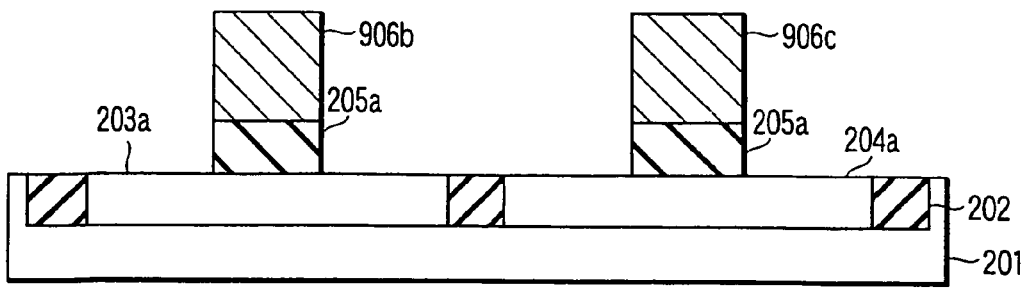
FIG. 35 is a sectional view showing a process of manufacturing the semiconductor device of the fifth embodiment.
Figure 36:
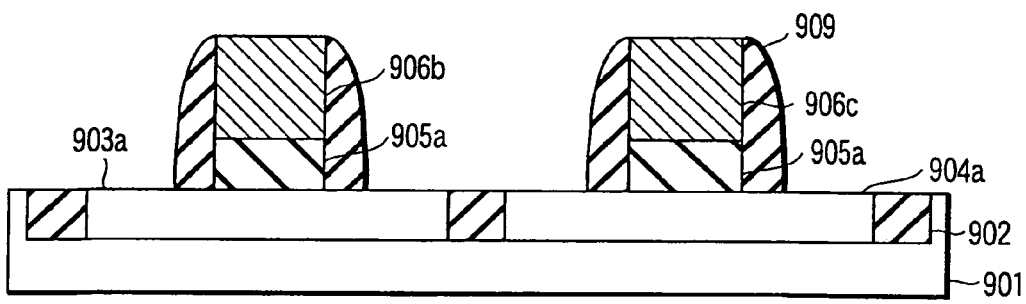
FIG. 36 is a sectional view showing a process of manufacturing the semiconductor device of the fifth embodiment.

Next, as shown in FIGS. 34 and 35, with a resist patterned by photolithography as a mask, the Si layer 906a is processed into a gate electrode shape by RIE. Thereafter, using a solution containing HF, the gate insulating film 905a is processed. Then, after another $SiO_2$ film is deposited on the entire surface, the $SiO_2$ film is etched back by RIE, thereby forming a gate sidewall $SiO_2$ film 909 with a thickness of 5 nm.

Figure 37:
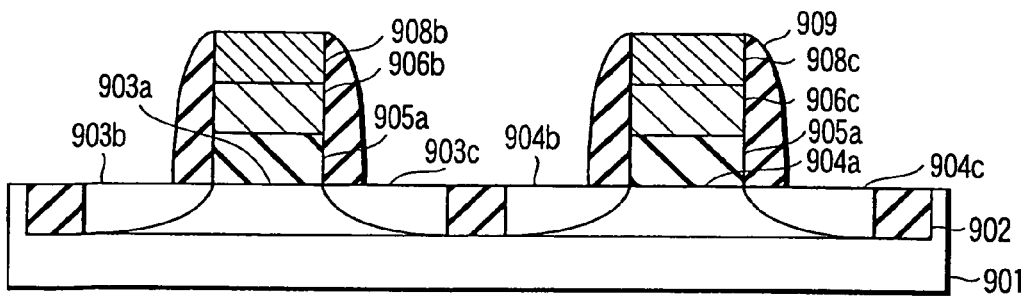
FIG. 37 is a sectional view showing a process of manufacturing the semiconductor device of the fifth embodiment.

Then, as shown in FIG. 37, with the Si layer 906b and the sidewall $SiO_2$ layer 909 as a mask, As is implanted with a dose of $1 \times 10^{15}$ $cm^{-2}$ at an acceleration voltage of 1 keV in the nMOS and B is implanted with a dose of $1 \times 10^{15}$ $cm^{-2}$ at an acceleration voltage of 0.2 keV in the pMOS. It is desirable that the regions 908b, 908c into which ions are implanted at that time should be made as thin as possible in the upper part of the regions 906b, 906c formed at the prior ion implantation.

Figure 38:
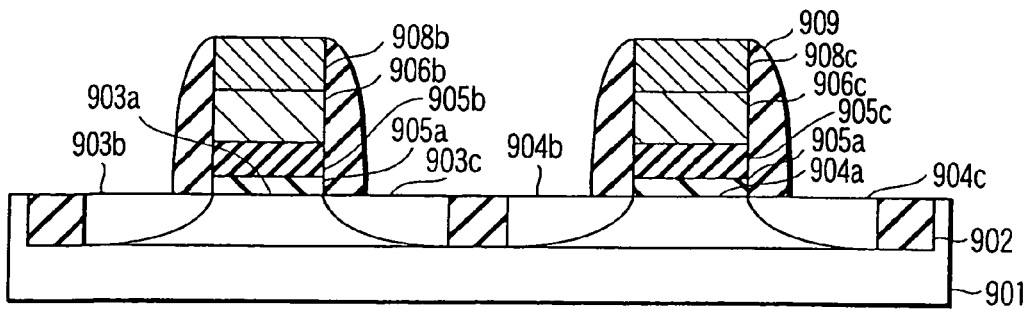
FIG. 38 is a sectional view showing a process of manufacturing the semiconductor device of the fifth embodiment.

Next, as shown in FIG. 38, RTA is performed at 1000° C. for one second to diffuse dopant into the gate insulating film 905a, thereby forming regions 905b, 905c containing B and As. At the same time, sources and drains 903b, 903c, 904b, 904c are electrically activated. At this time, it is desirable that the annealing time of RTA should be as short as possible so that the dopant in the regions 908b, 908c may not reach the regions 905b, 905c, respectively.

From this step on, the subsequent processes, including the formation of the $CoSi_2$ layer shown in FIG. 39 and wiring processes in FIG. 40, are the same as in the first embodiment.

Furthermore, as shown in FIG. 41, a layer 906f to suppress the diffusion of dopant in activation RTA may be provided in the Si layer 906a. In this case, it is desirable not to disturb the process of forming metal gate electrodes 906d, 906e, 908d, 908e from the Si layer 906a shown in FIG. 39, if possible. For example, after the Si layer 906a is formed to a thickness of 80 nm by the aforementioned method, it is heat-treated at about 800° C. or lower in an oxygen-containing atmosphere, thereby producing an oxidized-Si-layer with a thickness of about 0.3 nm to 1 nm as the region 906f. Then, an Si layer 906a is formed to a thickness of 70 nm by the aforementioned method. As shown in FIG. 42, the layer 906f prevents dopant in the regions 908b, 908c from diffusing and reaching the regions 905b, 905c, which enables the activation of source and drain, as shown in FIG. 38, at higher temperature than 1000° C. and for a longer time than one second.

Hereinafter, modifications of the first to fifth embodiments will be explained. The first to fifth embodiments may be used independently or combined suitably. In addition to this, they may be combined with any of the methods explained below.

Figure 31A:
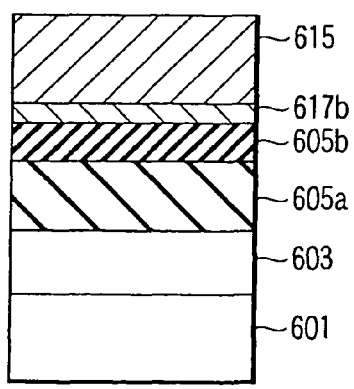
FIGS. 31A and 31B are sectional views of a MOS structure showing a basic structure of a semiconductor device according to a modification of each of the first to fourth embodiments.
Figure 31B:
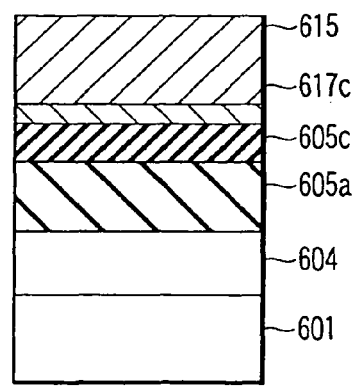

FIGS. 31A and 31B are sectional views of a MOS structure showing the basic structure of a semi-conductor device according to a modification of the embodiments. FIG. 31A shows an nMOS structure and FIG. 31B shows a pMOS structure.

As shown in FIG. 31A, a B-contained Si layer 617b with a thickness of about 0.3 nm to 3 nm may be provided between a gate insulating film 605b with fixed charges produced by the inclusion of B and a metal gate electrode 615. Since the metal layer 615 has a higher free electron density than that of the Si layer 617b, making the Si layer 617b to a thickness of about 3 nm or less causes the metal layer 615 to be dominant as a gate electrode. The Si layer 617b can prevent B from diffusing from the gate insulating film 605b into the metal gate electrode 615 in manufacturing LSIs and also preventing the fixed charges to decrease and the threshold value to change.

When CoSi$_2$ or NiSi$_2$ is used as the metal gate electrode 615, the Si layer 617b prevents Co or Ni from diffusing into the gate insulating film 605b and degrading the reliability of the gate insulating film 605a.

Similarly, as shown in FIG. 31B, in pMOS, in place of the Si layer 617b, an Si layer 617c containing one of P and As which is contained in the gate insulating film with fixed charges may be provided.

Furthermore, when the gate insulating films 205b, 205c with fixed charges are formed as shown in FIGS. 2 to 11, not only the ion implantation method but also EB techniques or thermal evaporation may be used to form the Si layers 206b, 206c containing B, P, As, or the like. When the Si layer is formed, it may be formed by supplying SiH$_4$ together with BH$_3$, PH$_3$, and AsH$_3$.

FIGS. 32A and 32B are sectional views of an nMOS structure showing the basic structure of a semi-conductor device according to a modification of the embodiments.

In nMOS of FIG. 32A, as a method for forming a gate insulating film 715b with fixed charges as shown in FIG. 32B, after forming a gate insulating film 705a and a metal gate electrode 715, B is implanted mainly into the vicinity 705b of the gate insulating film 705a in the metal gate electrode 715, and then the resulting film is heat treated to form the gate insulating film 715b. In the pMOS, P or As is implanted in place of B.

As described above, with the embodiments, when the gate insulating film containing Hf(Zr) contains B in the vicinity of its gate electrode in the nMOS and at least one of P and As in the vicinity of its gate electrode in the pMOS and the gate electrode contains a metal with a work function near the mid-gap, this makes it possible to obtain a large difference in work function between the gate electrode in the nMOS and that in the pMOS. At this time, making use of the fact that B produces positive fixed charges and P or As produces negative charges in the gate insulating film, the threshold voltage of nMOS and that of pMOS are changed. This enables a CMOS to be produced using one type of metal common to nMOS and pMOS as a gate electrode. Furthermore, the reliability can be maintained higher than in a case where metal impurity is introduced instead of P, As, or B as disclosed in Jpn. Pat. Appln. KOKAI Publication No. 2002-280461.

According to the embodiments of the present invention, it is possible to provide a semiconductor device with low threshold voltages which uses one type of metal for the gate electrodes of nMOS and pMOS and a method of manufacturing the semiconductor device.

Furthermore, B is introduced into a part or all of a silicate-based gate insulating film containing hafnium or zirconium, or both hafnium and zirconium in the nMOS structure on a semiconductor substrate, and at least one of P and As is introduced similarly in the pMOS structure, thereby providing a region with fixed charges, which makes it easy to design a circuit using a CMOS having one kind of metal gate electrode. In addition, for example, when nonmetal P, As, or B was introduced into an HfSiO-based material, the deterioration in TDDB was not observed. That is, it is possible to keep the reliability higher than in a case where metal impurity is introduced instead of P, As, or B as disclosed in Jpn. Pat. Appln. KOKAI Publication No. 2002-280461.

In addition, this invention may be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of manufacturing a semiconductor device comprising:
    forming a gate insulating layer on a semiconductor substrate, the gate insulating layer made of a first insulator including a metal element;
    forming a fixed charge element layer on the gate insulating layer, the fixed charge element layer made of a second insulator including a fixed charge element with a fixed charge; and
    forming a gate electrode on the fixed charge element layer,
    wherein the fixed charge is a positive fixed charge, when the semiconductor substrate, the gate insulating layer, the fixed charge element layer and the gate electrode comprise a n-channel MOSFET,
    wherein the fixed charge is a negative fixed charge, when the semiconductor substrate, the gate insulating layer, the fixed charge element layer and the gate electrode comprise a p-channel MOSFET.

2. The method according to claim 1, further comprising:
    introducing the fixed charge element into the fixed charge element layer through a diffusion of the fixed charge element from the gate electrode.

3. The method according to claim 1, further comprising:
    forming a Si layer between the fixed charge element layer and the gate electrode.

4. The method according to claim 3, wherein the Si layer includes the fixed charge element.

5. The method according to claim 4, further comprising:
    forming a preventing layer between the Si layer and the gate electrode,
    wherein the preventing layer prevents an element in the gate electrode from diffusing.

6. The method according to claim 1, wherein the metal element is a tetravalent metal element.

7. The method according to claim 1, wherein each of the first and second insulators is one selected from a group of oxide, nitride and oxynitride.

8. The method according to claim 1, wherein the positive fixed charge element is one selected from a group of B, Al, Ga, In and Tl.

9. The method according to claim 1, wherein the negative fixed charge element is one selected from a group of P, As, N, Sb and Bi.

10. The method according to claim 1, wherein the second insulator includes the metal element.

11. The method according to claim 1, wherein the first and second insulators include a metal element selected from a group of Ti, Hf and Zr.

12. The method according to claim 1, wherein the gate electrode includes a metal element selected from a group of Fe, Co, Ni, Ti, Hf and Zr.

13. The method according to claim 1, wherein the gate electrode includes a dopant selected from a group of Si, Ge, N, B, P and As.

14. The method according to claim 1, wherein the gate electrode includes Hf and Si, when the first and second insulators include Hf and Si.

15. The method according to claim 1, wherein the gate electrode is made of a material having a work function of 4 eV to 5.5 eV.

* * * * *